United States Patent
Han et al.

(10) Patent No.: US 7,961,531 B2
(45) Date of Patent: Jun. 14, 2011

(54) VOLTAGE SENSING CIRCUIT CAPABLE OF CONTROLLING A PUMP VOLTAGE STABLY GENERATED IN A LOW VOLTAGE ENVIRONMENT

(75) Inventors: Woo-Seung Han, Kyoungki-do (KR); Khil-Ohk Kang, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 62 days.

(21) Appl. No.: 12/134,825

(22) Filed: Jun. 6, 2008

(65) Prior Publication Data
US 2009/0175095 A1 Jul. 9, 2009

(30) Foreign Application Priority Data
Jan. 9, 2008 (KR) .................. 10-2008-0002554

(51) Int. Cl.
*G11C 5/14* (2006.01)
(52) U.S. Cl. .............. 365/189.09; 365/189.07; 365/208; 365/207; 327/541; 327/537; 327/535
(58) Field of Classification Search .................. 365/208, 365/210.1, 207, 205, 190, 189.09, 189.07, 365/189.15; 327/537, 535, 541, 540, 538
See application file for complete search history.

(56) References Cited

U.S. PATENT DOCUMENTS

| 6,088,270 A | * | 7/2000 | Hardee | ................. 365/189.05 |
| 7,023,262 B2 | * | 4/2006 | Sim et al. | ................. 327/541 |
| 2006/0158946 A1 | * | 7/2006 | Taddeo | ................. 365/208 |
| 2007/0097768 A1 | * | 5/2007 | Barth, Jr. | ................. 365/208 |

FOREIGN PATENT DOCUMENTS

| KR | 1998-0074416 | 11/1998 |
| KR | 1020060127315 A | 12/2006 |

OTHER PUBLICATIONS

Notice of Allowance issued from Korean Intellectual Property Office on May 30, 2009 with an English Translation.

* cited by examiner

*Primary Examiner* — Andrew Q Tran
(74) *Attorney, Agent, or Firm* — IP & T Group LLP

(57) ABSTRACT

Herein, a voltage sensing circuit, which is capable of controlling a pumping voltage to be stably generated in a low voltage environment, is provided. The voltage sensing circuit includes a current mirror having first and second terminals, a first switching element configured to control current on the first terminal of the current mirror by a reference voltage, a second switching element configured to control current from the second terminal of the current mirror in response to a pumping voltage, and a third switching element configured to control current sources of the first and second switching elements to receive a negative voltage.

9 Claims, 5 Drawing Sheets

VOLTAGE SENSING CIRCUIT CAPABLE OF CONTROLLING A PUMP VOLTAGE STABLY GENERATED IN A LOW VOLTAGE ENVIRONMENT

CROSS-REFERENCE(S) TO RELATED APPLICATIONS

The present invention claims priority of Korean patent application number 10-2008-0002554, filed on Jan. 9, 2008, which is incorporated by reference in its entirety.

BACKGROUND OF THE INVENTION

The present invention relates to a semiconductor memory device, and more particularly to a pumping voltage sensing circuit capable of controlling a pumping voltage to be stably generated in a low voltage environment and a method of sensing the pumping voltage.

Semiconductor memory devices are used in various fields, one of which is storing various data. Since the semiconductor memory devices are used for various portable apparatuses such as desktop computers and notebook computers, the semiconductor memory devices are developed to meet various requirements such as larger capacity, higher operating speed, smaller size, and lower power consumption.

As a method of designing a semiconductor memory device to operate with low power consumption, a technology for minimizing the consumption of current in the core area of a semiconductor memory device is provided. The core area includes memory cells, bit lines, and word lines and is designed in accordance with an extremely fine design rule. Therefore, in order to design an extremely fine semiconductor memory device that performs a high frequency operation, a power source voltage is basically required to be very low. A power source voltage of no more than 1.5 volts is currently applied.

On the other hand, the semiconductor memory device generates internal voltages using an external power source voltage of no more than 1.5 volts. One of the methods of generating the internal voltages is to generate internal electric potentials higher than the external power source potential or lower than ground potential using a charge pump.

Among the internal voltages generated by charge pumping, a high level pumping voltage, i.e., a boost voltage VPP, and a low level pumping voltage, i.e., a back bias voltage VBB, are most commonly used for a semiconductor memory device such as DRAM. The boost voltage VPP is applied to a gate of a cell transistor, i.e., a word line, as a higher potential than a power source voltage VCC or VDD in order to access a cell. In order to prevent data stored in the cell from being lost, the back bias voltage VBB lower than a ground voltage VSS is applied to a bulk BULK of the cell transistor.

The boost voltage VPP that is higher than a supplied power source and that is mainly supplied to word lines will be described.

FIG. 1 is a block diagram of an internal voltage generating circuit of a conventional semiconductor memory device.

As described above, the internal voltage generating circuit for generating a pumping voltage VPP includes a voltage sensing circuit 10, a ring oscillator 20, a control signal generator 30, and a pumping circuit 40. The voltage sensing circuit 10 compares a reference voltage VREF with a fed-back pumping voltage VPP to sense the level of the pumping voltage VPP so that the pumping voltage can maintain a constant voltage level. The ring oscillator 20 generates a clock signal OSC for generating the pumping voltage VPP based on an output signal VPPE of the voltage sensing circuit 10. The control signal generator 30 generates control pulses for controlling the pumping circuit 40. The pumping circuit 40 generates the pumping voltage VPP by boosting an external voltage VDD in response to an output signal of the control signals generator 30.

The voltage sensing circuit 10 compares the reference voltage VREF with the fed-back pumping voltage VPP and outputs a pumping voltage enable signal VPP_EN when the fed-back pumping voltage is lower than the reference voltage VREF. The pumping voltage enable signal VPP_EN enables the ring oscillator 20 and the clock signal OSC generated by the oscillator 20 is supplied to the control signal generator 30. The control signal generator 30 outputs the control pulses in response to the clock signal OSC. The pumping circuit 40 is enabled by the control pulses to generate the pumping voltage VPP by boosting the power source voltage VDD.

That is, the pumping circuit 40 is enabled when the fed-back pumping voltage VPP is lower than the reference voltage VREF and generates the pumping voltage VPP by boosting the power source voltage VDD. As described above, the pumping circuit 40 operates based on the detection value of the voltage sensing circuit 10 for comparing the fed-back pumping voltage with the reference voltage to sense a voltage level.

FIG. 2 is a schematic circuit diagram of the voltage sensing circuit in FIG. 1.

The voltage sensing circuit 10 includes a voltage dividing unit 12, a comparing unit 14, and a buffering unit 16.

The voltage dividing unit 12 includes a plurality of resistors R1 to R4 serially connected between the fed-back pumping voltage VPP and the ground voltage VSS. The fed-back pumping voltage VPP is divided by the ratios of the plurality of resistors R1 to R4 to generate a divided voltage VPP_REF.

The comparing unit 14 includes three NMOS transistors N1 to N3 and two PMOS transistor P1 and P2 to compare the divided voltage VPP_REF obtained by dividing the fed-back pumping voltage VPP with the reference voltage VREF. That is, the divided voltage VPP_REF is input to the gate terminal of a first NMOS transistor N1 and the reference voltage VREF is input to the gate terminal of a second NMOS transistor N2. Then, the source terminals of the two NMOS transistors N1 and N2 are connected to the drain terminal of a third NMOS transistor N3 that receives a bias voltage VBIAS through the gate terminal thereof. The source terminal of the third NMOS transistor N3 is connected to the ground voltage VSS. Then, the drain terminals of the NMOS transistors N1 and N2 are connected to the PMOS transistors P1 and P2 that constitute a current mirror. That is, the current of one terminal of the current mirror is controlled by the first NMOS transistor N1 as a switching element and the current of the other terminal of the current mirror is controlled by the second NMOS transistor N2 as a switching element. The output terminal of the comparing unit 14 is provided between the second PMOS transistor P2 that constitutes the current mirror and the second NMOS transistor N2 that receives the reference voltage.

The buffering unit 16 includes an inverter IV1 connected to the output terminal of the comparing unit 14 to buffer the comparison result of the comparing unit 14.

The conventional voltage sensing circuit having the above structure operates as follows.

The fed-back pumping voltage VPP is divided by the resistor R1 to R4 in the voltage dividing unit 12. The divided voltage VPP_REF is compared with the reference voltage VREF by the comparing unit 14. When the divided voltage VPP_REF is lower than the reference voltage VREF, the output of the comparing unit 14 is in a logic low level and the logic low level signal is inverted by the buffering unit 16 to output a logic high level signal. At this time, the voltage sensing circuit 10 outputs the pumping voltage enable signal VPP_EN for generating the pumping voltage. The pumping voltage enable signal VPP_EN enables the ring oscillator 20 to generate the pumping voltage VPP.

To the contrary, when the divided voltage VPP_REF is higher than the reference voltage VREF, the output of the comparing unit 14 is in a logic high level and the logic high level signal is inverted by the buffering unit 16 to output a logic low level signal. At this time, the voltage sensing circuit 10 controls the pumping voltage enable signal VPP_EN to be disabled. That is, the ring oscillator 20 is no longer driven.

On the other hand, as described above, the design environment of the semiconductor memory device is changed for the semiconductor memory device to be capable of operating at a low voltage. That is, a power source voltage of no more than 1.5 volts can be applied.

When the supplied power source voltage VDD is reduced to less than 1.5 volts, in the structure of the comparing unit 14, a node voltage between the first PMOS transistor P1 and the first NMOS transistor N1 is reduced to turn on the first PMOS transistor P1. Therefore, the first NMOS transistor N1 can be turned on only when the node voltage between the first and the third NMOS transistors N1 and N3 is reduced.

However, in the conventional voltage sensing circuit, a ground voltage (0 volt) is used as the source voltage of the third NMOS transistor N3 in an environment where the power source voltage VDD is reduced. Therefore, the third NMOS transistor N3 falls into a triode area so that the third NMOS transistor N3 does not operate as the current source.

SUMMARY OF THE INVENTION

Embodiments of the present invention are directed to providing a voltage sensing circuit capable of controlling a pumping voltage to be stably generated even in a low voltage environment, and a method of sensing the pumping voltage.

In addition, embodiments of the present invention are directed to providing a voltage sensing circuit capable of supplying a stable current source using a negative voltage in accordance with a degree to which a power source voltage is reduced, and a method for operating the same.

In order to accomplish these objects, a voltage sensing circuit in accordance with the present invention generates a negative voltage according to a degree to which a power source voltage is reduced in order to stably generate a pumping voltage in a low voltage environment. Thus, a generated negative voltage is used for a current source when a fed-back pumping voltage is compared with a reference voltage. Therefore, as the power source voltage is reduced, the current source limited to a ground voltage is varied, and thus a stable current source is supplied.

In accordance with an aspect of the present invention, a voltage sensing circuit includes a current mirror having first and second terminals, a first switching element configured to control current on the first terminal of the current mirror by a reference voltage, a second switching element configured to control current from the second terminal of the current mirror in response to a pumping voltage, and a third switching element configured to control current sources of the first and second switching elements to receive a negative voltage.

In accordance with another aspect of the present invention, a voltage sensing circuit includes a voltage dividing unit configured to divide a fed-back pumping voltage to output the divided pumping voltage, and a differential amplifier configured to perform differential amplification with a reference voltage as a first input and the divided pumping voltage as a second input, the differential amplifier having a current source that receives a negative voltage.

In accordance with yet another aspect of the present invention, a method of sensing a voltage includes dividing a fed-back pumping voltage to output a divided pumping voltage, supplying a negative voltage to current sources of differential amplifiers, differentially amplifying a difference between the divided pumping voltage and a reference voltage using the differential amplifiers, and buffering the result of the amplification differentially.

In accordance with still another aspect of the present invention, a semiconductor memory device includes a voltage dividing unit configured to divide a pumping voltage to output the divided pumping voltage, a differential amplifier configured to perform differential amplification with a reference voltage as a first input and the divided pumping voltage as a second input, the differential amplifier having a current source that receives a negative voltage, a ring oscillator configured to generate a clock signal based on an output signal from the differential amplifier, a control signal generator configured to generate a control pulse in respond to the clock signal, and a pumping circuit configured to generate the pumping voltage by boosting an external voltage in response to the control pulse.

DESCRIPTION OF SPECIFIC EMBODIMENTS

Hereinafter, a voltage sensing circuit in accordance with the present invention and a method of sensing a voltage will be described in detail with reference to the accompanying drawings.

Figure 1:
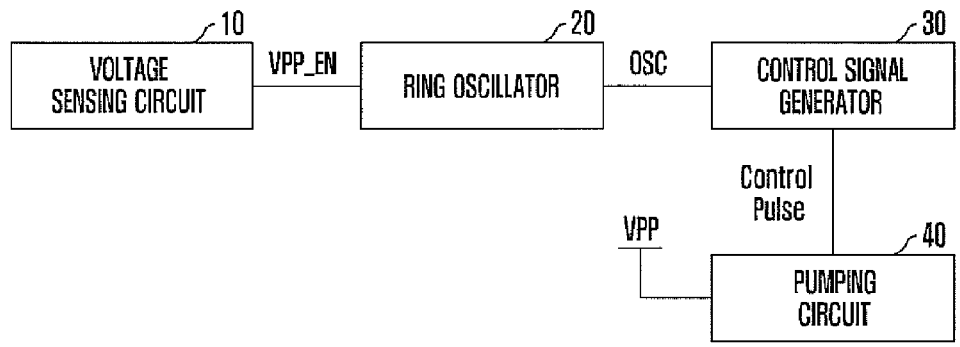
FIG. 1 is a block diagram illustrating an internal voltage generating circuit of a conventional semiconductor memory device.
Figure 2:
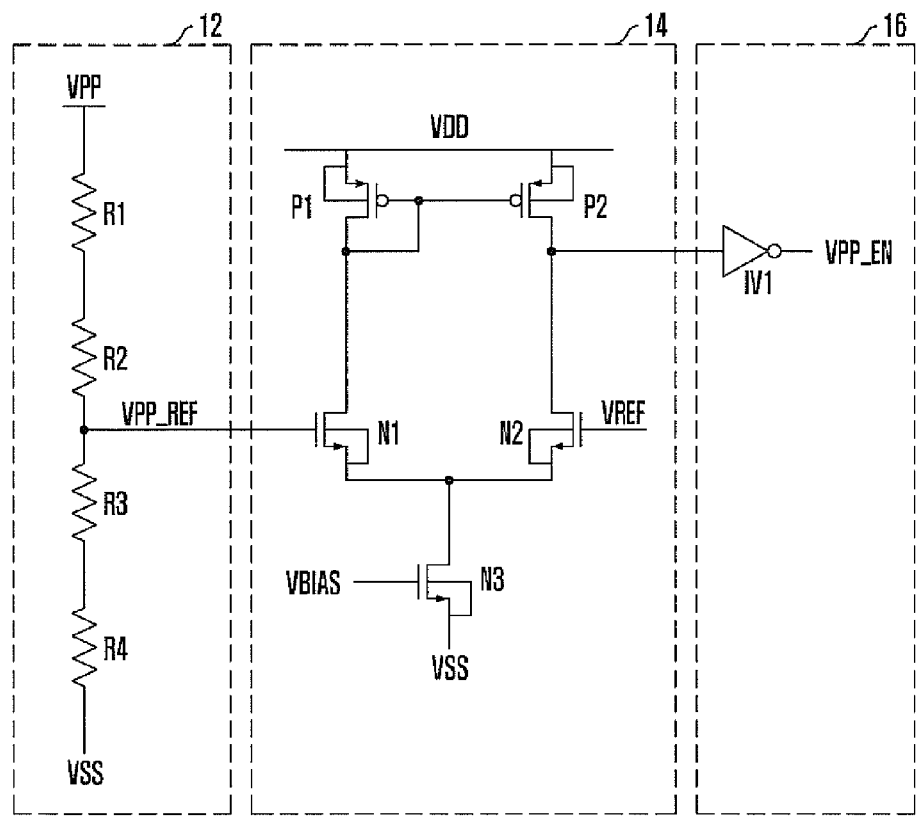
FIG. 2 is a schematic circuit diagram illustrating a voltage sensing circuit of the internal voltage generating circuit in FIG. 1.
Figure 3:
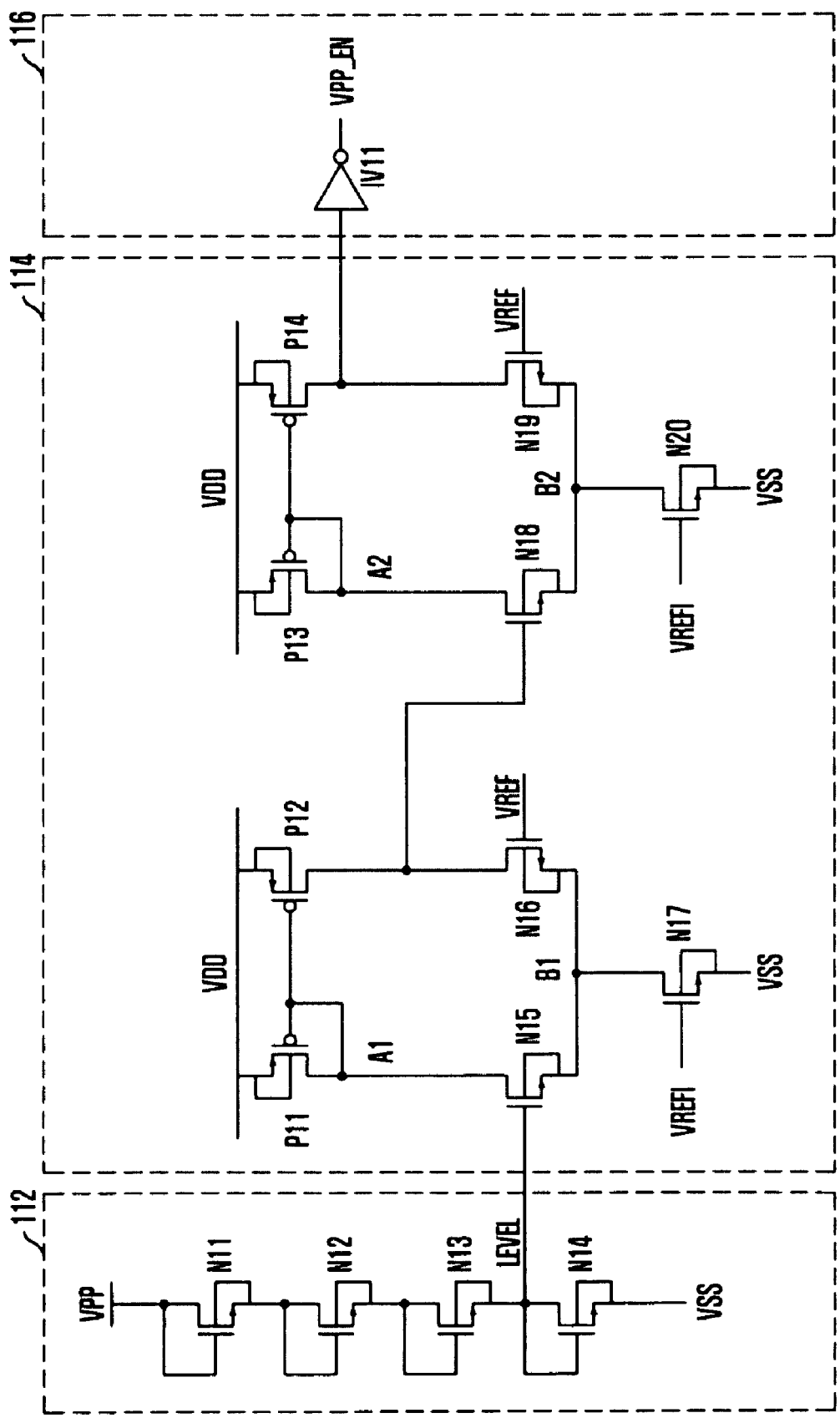
FIG. 3 is a schematic circuit diagram of a voltage sensing circuit in accordance with an embodiment of the present invention.

FIG. 3 is a schematic circuit diagram of a voltage sensing circuit in accordance with an embodiment of the present invention.

As described above, the voltage sensing circuit according to the present invention includes a voltage dividing unit 112, a comparing unit 114, and a buffering unit 116.

The voltage dividing unit 112 includes a plurality of NMOS transistors N11 to N14 as resistance elements, which are serially connected between a fed-back pumping voltage VPP and a ground voltage VSS. The fed-back pumping voltage VPP is divided by the ratios of the plurality of resistance elements to output a divided potential level signal LEVEL.

The comparing unit 114 includes differential amplifiers for differentially amplifying the level signal LEVEL output by the voltage dividing unit 112 and a reference voltage VREF in two processes.

That is, the comparing unit 114 includes first and second NMOS transistors N15 and N16 as the input ends of a first differential amplifier for receiving the level signal LEVEL and the reference voltage VREF, respectively. The level signal LEVEL corresponds to the pumping voltage VPP and the reference voltage VREF is used for detecting the level of the pumping voltage VPP. The pumping voltage VPP and the reference voltage VREF are input to the gate terminals of the first and second NMOS transistors N15 and N16, respectively.

First and second PMOS transistors P11 and P12 are further provided to the first differential amplifier to form a current mirror. The first PMOS transistor P11 is serially connected between the first NMOS transistor N15 and a supply voltage VDD. The second PMOS transistor P12 is serially connected between the second NMOS transistor N16 and the supply voltage VDD.

The source terminals of the first and second NMOS transistors N15 and N16 are connected to a common terminal B1 to which a third NMOS transistor N17, which operates as the current source of the first differential amplifier, is connected. A reference voltage VREFI is input to the gate terminal of the third NMOS transistor N17 and the source terminal of the third NMOS transistor N17 is connected to a ground voltage VSS.

The output node of the first differential amplifier is provided between the second PMOS transistor P12 and the second NMOS transistor N16. The output node of the first differential amplifier is connected to a second differential amplifier that performs a second differential amplification of the comparing unit 114.

The second differential amplifier includes fourth and fifth NMOS transistors N18 and N19 for receiving an output signal of the first differential amplifier and the reference voltage VREF, respectively. The output signal of the first differential amplifier and the reference voltage VREF are input to the gate terminals of the fourth and fifth NMOS transistors N18 and N19, respectively.

Third and fourth PMOS transistors P13 and P14 are further provided to the second differential amplifier to form a current mirror. The third PMOS transistor P13 is serially connected between the fourth NMOS transistor N18 and the supply voltage VDD. The fourth PMOS transistor P14 is serially connected between the fifth NMOS transistor N19 and the supply voltage VDD. The output node of the second differential amplifier is provided between the fourth PMOS transistor P14 and the fifth NMOS transistor N19.

The source terminals of the fourth and fifth NMOS transistors N18 and N19 are connected to a common terminal B2 to which a sixth NMOS transistor N20, which operates as the current source of the second differential amplifier, is connected. The reference voltage VREFI is input to the gate terminal of the sixth NMOS transistor N20 and the source terminal of the sixth NMOS transistor N20 is connected to the ground voltage VSS.

The reference voltages VREFI and VREF are generated by internal voltage generating units provided in a semiconductor memory device to be set as signals used for various circuits in the semiconductor memory device. It is also set to supply stable current to the comparing unit 114.

The buffering unit 116 is connected to the output node of the second differential amplifier to buffer a comparison result by an inverter IV11 therein and to output the buffered comparison result.

The voltage sensing circuit according to the present invention having the above-described structure operates as follows. The voltage dividing unit 112 divides the fed-back pumping voltage VPP in accordance with the internal resistance ratios. The NMOS transistors N11 to N14 operate as resistance elements. The voltage dividing unit 112 outputs the divided voltage as the level signal LEVEL.

The comparing unit 116 compares the level signal LEVEL with the reference voltage VREF. In FIG. 3, differential amplifying circuits are connected to each other in order to perform two differential amplification processes to increase the gain of a differential output. Therefore, although a difference in potential levels between the level signal LEVEL and the reference voltage VREF is small, the comparing unit 116 can output a signal corresponding to the difference. In particular, the comparing unit 116 uses the reference voltage VREFI to stably drive the current source transistors N17 and N20.

A voltage detecting signal, which is output from the comparing unit 116, is first buffered by the inverter IV11, which constitutes the buffering unit 116, before being output.

Figure 4:
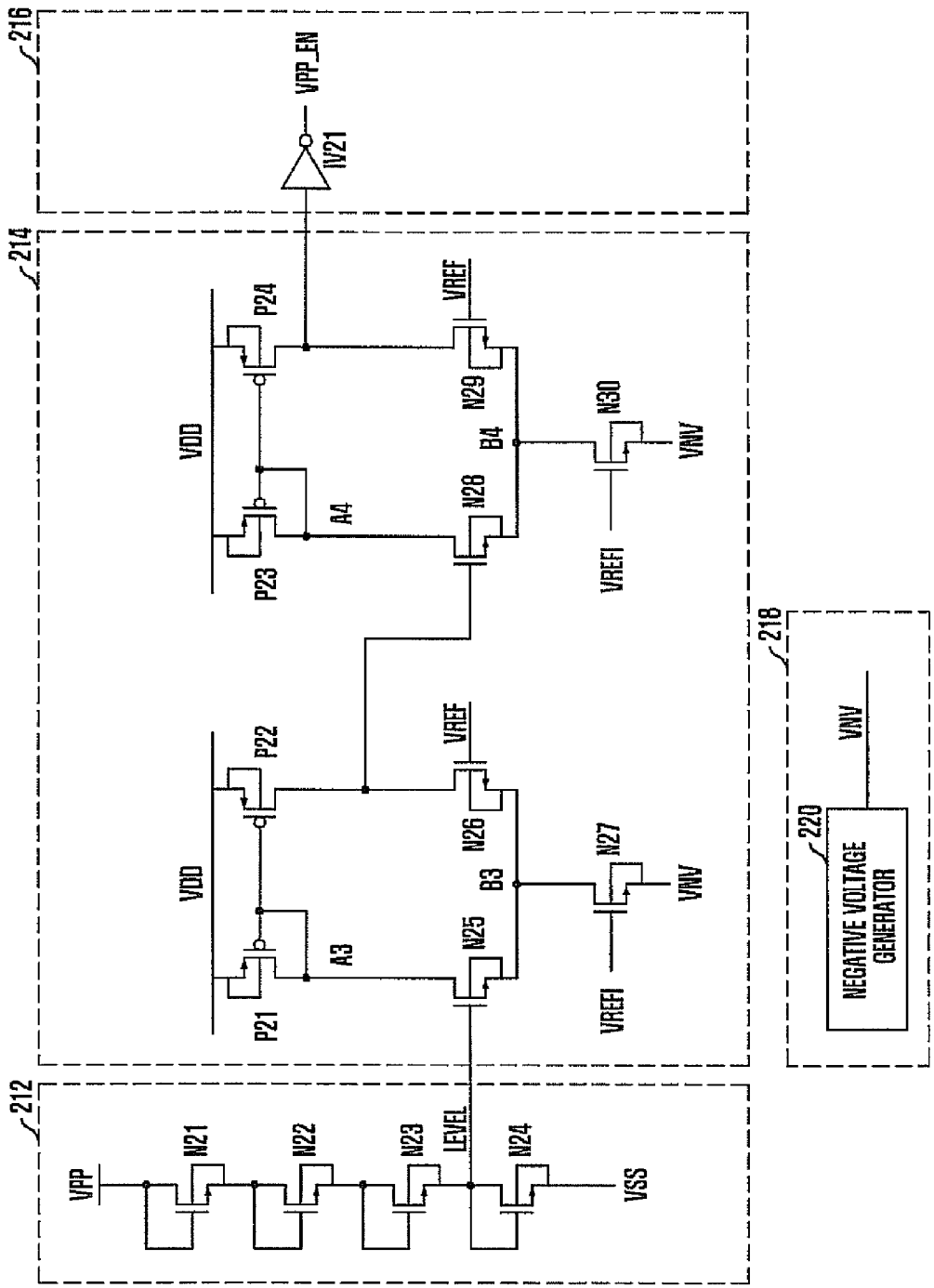
FIG. 4 is a schematic circuit diagram of a voltage sensing circuit in accordance with another embodiment of the present invention.

FIG. 4 is a schematic circuit diagram of a voltage sensing circuit in accordance with another embodiment of the present invention.

As described above, the voltage sensing circuit according to the present invention includes a voltage dividing unit 212, a comparing unit 214, and a buffering unit 216. The voltage sensing circuit further includes a negative voltage generating unit 218 for supplying a negative voltage to the current source of the comparing unit 214.

The voltage dividing unit 212 includes a plurality of NMOS transistors N21 to N24 as resistance elements, which are serially connected between a fed-back pumping voltage VPP and a ground voltage VSS. The fed-back pumping voltage VPP is divided by the ratios of the plurality of resistance elements to output a divided potential level signal LEVEL.

The comparing unit 214 includes differential amplifiers for differentially amplifying the level signal LEVEL output by the voltage dividing unit 212 and a reference voltage VREF in two processes.

That is, the comparing unit 214 includes first and second NMOS transistors N25 and N26 as the input ends of a first differential amplifier for receiving the level signal LEVEL and the reference voltage VREF, respectively. The level signal LEVEL corresponds to the pumping voltage VPP and the reference voltage VREF is used for detecting the level signal LEVEL of the pumping voltage VPP. The level signal LEVEL and the reference voltage VREF are input to the gate terminals of the first and second NMOS transistors N25 and N26, respectively.

First and second PMOS transistors P21 and P22 are further provided to the first differential amplifier to form a current mirror. The first PMOS transistor P21 is serially connected between the first NMOS transistor N25 and a supply voltage VDD. The second PMOS transistor P22 is serially connected between the second NMOS transistor N26 and the supply voltage VDD.

The source terminals of the first and second NMOS transistors N25 and N26 are connected to a common terminal B3 to which a third NMOS transistor N27, which operates as the current source of the first differential amplifier, is connected to. A reference voltage VREFI is input to the gate terminal of the third NMOS transistor N17 and the source terminal of the third NMOS transistor N17 is connected to a negative voltage VNV.

The output node of the first differential amplifier is provided between the second PMOS transistor P22 and the second NMOS transistor N26. The output node of the first differential amplifier is connected to a second differential amplifier that performs a second differential amplification of the comparing unit 214.

The second differential amplifier includes fourth and fifth NMOS transistors N28 and N29 for receiving an output signal of the first differential amplifier and the reference voltage VREF, respectively. The output signal of the first differential amplifier and the reference voltage VREF are input to the gate terminals of the fourth and fifth NMOS transistors N28 and N29, respectively.

Third and fourth PMOS transistors P23 and P24 are further provided to the second differential amplifier to form a current mirror. The third PMOS transistor P23 is serially connected between the fourth NMOS transistor N28 and the supply voltage VDD. The fourth PMOS transistor P24 is serially connected between the fifth NMOS transistor N29 and the supply voltage VDD. The output node of the second differential amplifier is provided between the fourth PMOS transistor P24 and the fifth NMOS transistor N29.

The source terminals of the fourth and fifth NMOS transistors N28 and N29 are connected to a common terminal B4 to which a sixth NMOS transistor N30 that operates as the current source of the second differential amplifier is connected. The reference voltage VREFI is input to the gate terminal of the sixth NMOS transistor N30 and the source terminal of the sixth NMOS transistor N30 is connected to the negative voltage VNV.

The reference voltages VREFI and VREF are generated by internal voltage generating units provided in a semiconductor memory device to be set as signals used for various circuits in the semiconductor memory device. They are also set to supply stable current to the comparing unit 214.

The buffering unit 216 is connected to the output node of the second differential amplifier to buffer a comparison result using an inverter IV21 therein, and to output the buffered comparison result.

According to an embodiment of the present invention, the negative voltage generating unit 218 for generating the negative voltage to be used for the comparing unit 214 is provided. The negative voltage generating unit 218 includes a negative voltage generator 220 and supplies the negative voltage generated by the negative voltage generator 220 to the comparing unit 214.

At this time, the negative voltage is generated in accordance with a degree to which the supply voltage VDD is reduced. The degree to which the supply voltage VDD is reduced is previously set in a development environment so that the generated negative voltage is determined as the previously set value.

The voltage sensing circuit according to the present invention having the above-described structure operates as follows. The voltage sensing circuit outputs a logic high level signal when the fed-back pumping voltage VPP is lower than a target voltage to increase the pumping voltage VPP, and outputs a logic low level signal when the fed-back pumping voltage VPP is higher than the target voltage to stop increasing the pumping voltage VPP. To this end, the voltage sensing circuit detects the level of the fed-back pumping voltage VPP.

First, in order to control the operation of the two differential amplifiers that constitute the comparing unit 214, the negative voltage VNV generated by the negative voltage generating unit 218 is supplied to the source terminals of the third and sixth NMOS transistors N27 and N30 that are the current sources of the two differential amplifiers. Under the above-described state, the operations of the two differential amplifiers start while the reference voltage VREFI is supplied to the third and sixth NMOS transistors N27 and N30.

Additionally, the fed-back pumping voltage VPP is divided by the voltage dividing unit 212 to output a potential level signal LEVEL in accordance with the resistance ratios of MOS transistors N21 to N24. The comparing unit 214 primarily compares the level signal LEVEL with the reference voltage VREF by the first differential amplifier.

At this time, due to the effect of the low power source voltage VDD (about 1.5 volts), the voltage of a node A3 decreases to turn on the first PMOS transistor P21. Therefore, a difference in potential levels between the level signal LEVEL and the reference signal VREF that are compared with each other by the first differential amplifier is small. However, although the difference in the potential levels between the level signal LEVEL and the reference signal VREF is small, since the source voltage of the third transistor N27 is a negative voltage, the voltage of the node B3 decrease enough to turn on the first NMOS transistor N25.

The level signal LEVEL that is differentially amplified by the first differential amplifier is differentially amplified again by the second differential amplifier. As described above, according to the present invention, the second process differential amplification is performed to increase the gain of the output signal.

That is, the comparing unit 214 differentially amplifies the fed-back pumping voltage VPP and the reference voltage VREF in two processes. When the fed-back pumping voltage VPP is lower than the reference voltage VREF, the comparing unit 214 outputs a logic low level signal. The logic low level signal is buffered by the inverter IV21 in the buffering unit 216 to generate an enable signal VPP_EN having a logic high level for increasing the pumping voltage. In contrast, the comparing unit 214 outputs a logic high level signal when the fed-back pumping voltage VPP is higher than the reference voltage VREF. The logic high level signal is buffered by the inverter IV21 in the buffering unit 216 to generate the enable signal VPP_EN having a logic low level to stop the pumping voltage from increasing anymore.

The voltage sensing circuit according to the present invention controls the current of the output nodes of the differential amplifiers by the current mirrors P21 and P22, and P23 and P24. Therefore, the current that flows through the output nodes of the differential amplifiers is optimized by the structures of the current mirrors to stably control the voltages of the output nodes.

Figure 5:
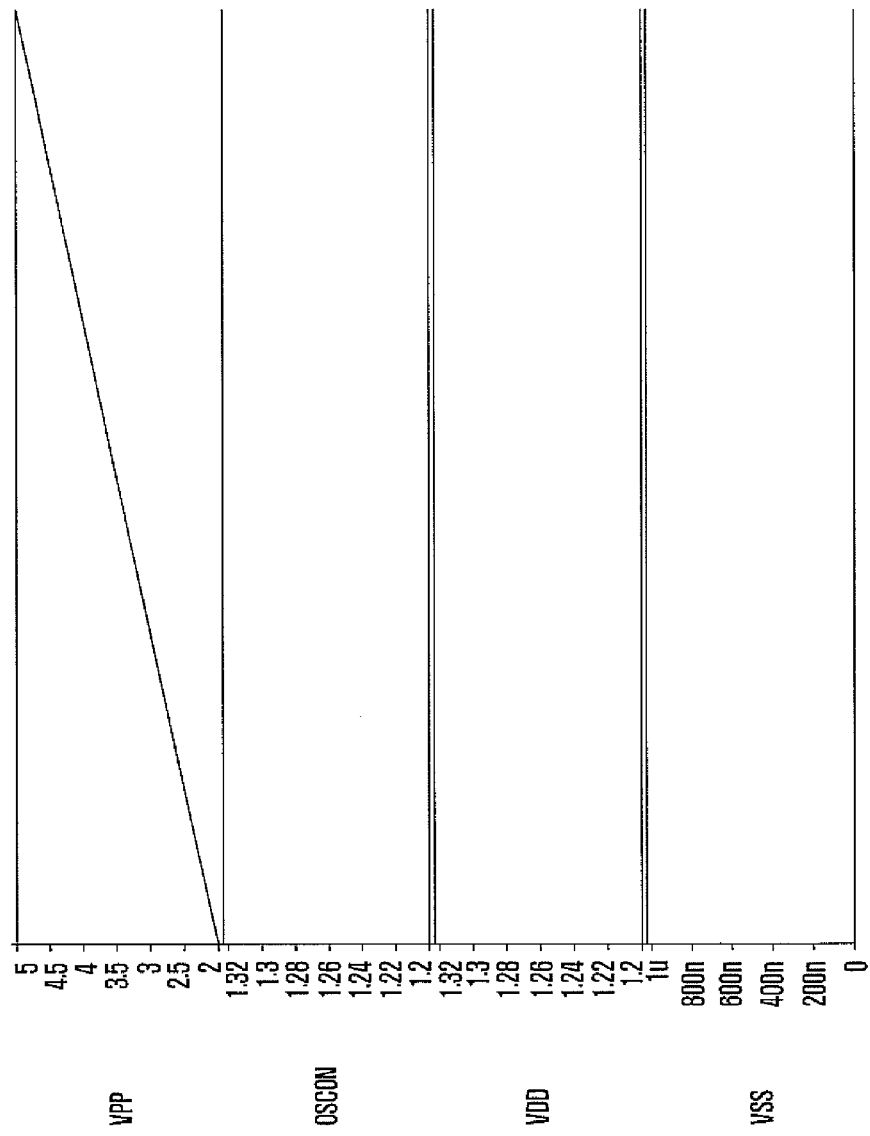
FIG. 5 is a signal timing diagram illustrating the operation of the conventional voltage sensing circuit.

The effect of the present invention can be clearly understood from FIG. 5, which is a signal timing diagram illustrating the operation of the conventional voltage sensing circuit.

FIG. 5 is a signal timing diagram simulated when the power source voltage VDD is 1.2 volts and the source terminals of the current sources N27 and N30 of the comparing unit 14 are connected to the ground power source VSS of 0 volt. That is, as described above, due to the low power source voltage, the transistors N27 and N30 do not function as saturation current sources, and thus, the comparing unit 14 cannot operate normally. Therefore, although the potential of the pumping voltage VPP increases to be higher than the potential of the reference voltage VREF, a result value OSCON does not change.

Figure 6:
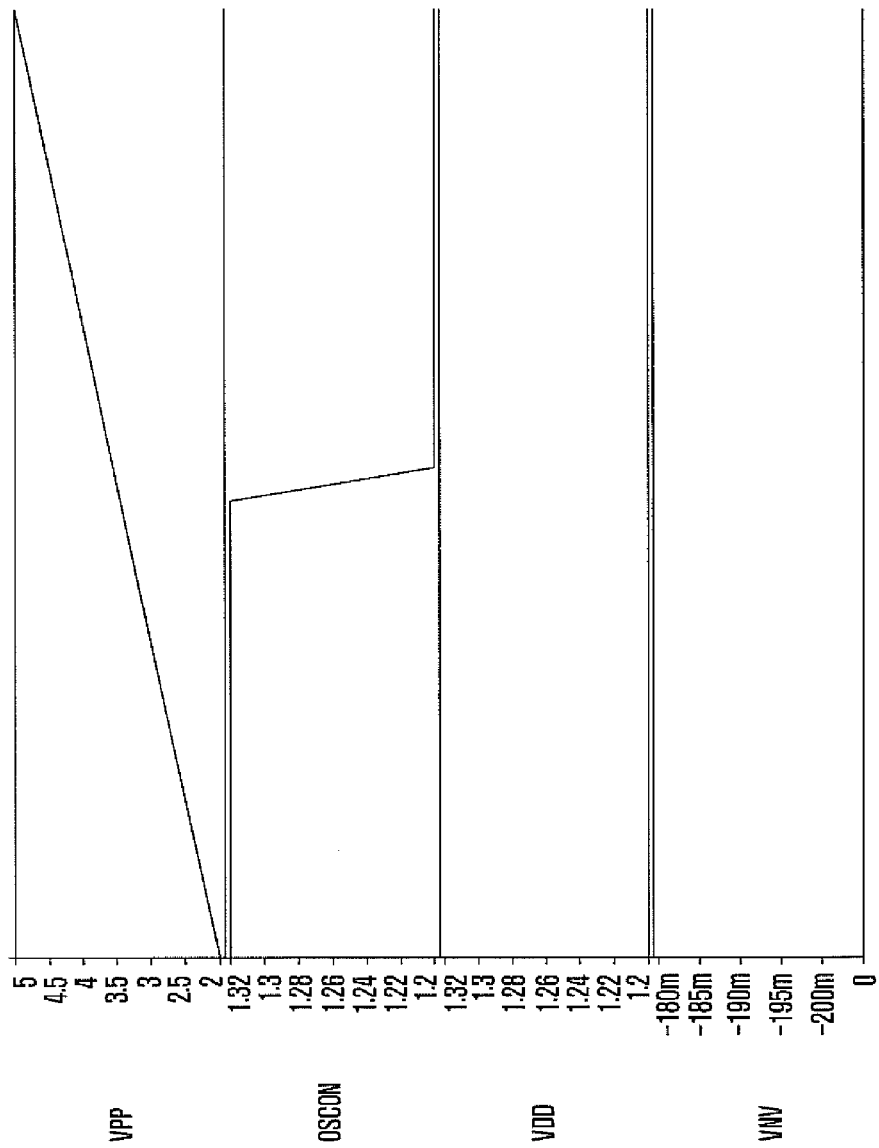
FIG. 6 is a signal timing diagram illustrating the operation of the voltage sensing circuit according to the present invention.

In contrast, a result obtained according to the present invention is illustrated in the signal timing diagram of FIG. 6. That is, when the source terminals of the current sources N27 and N30 of the comparing unit 14 are connected to a negative power source of −0.2 volt in accordance with the power source voltage VDD of 1.2 volts, although the power source voltage VDD is low, the transistors N27 and N30 operate as the saturation current sources. Therefore, the comparing unit 14 normally operates so that when the potential of the pumping voltage VPP increases to be higher than the potential of the reference voltage VREF, the result value OSCON changes from a logic high level to a logic low level.

Therefore, according to the present invention, the current source is used as the negative voltage in accordance with a reduced power source so that the level of the pumping voltage is stably detected and so that the pumping voltage can be stably generated.

While the present invention has been described with respect to the specific embodiments, it will be apparent to those skilled in the art that various changes and modifications may be made without departing from the spirit and scope of the invention as defined in the following claims.

What is claimed is:

1. A voltage sensing circuit, comprising:
   a current mirror having first and second terminals;
   a first switching element configured to control current on the first terminal of the current mirror by using a reference voltage;
   a second switching element configured to control current from the second terminal of the current mirror in response to a pumping voltage higher than a supply voltage; and
   a third switching element configured to control current on sources of the first and second switching elements by using a negative voltage lower than a ground voltage,
   wherein the voltage sensing circuit senses a level of the pumping voltage.

2. The voltage sensing circuit as recited in claim 1, wherein the third switching element is connected between a current source common terminal of the first and second switching elements and the negative voltage.

3. The voltage sensing circuit as recited in claim 2, wherein the third switching element includes an NMOS transistor.

4. The voltage sensing circuit as recited in claim 1, further comprising a voltage dividing unit for dividing the pumping voltage in accordance with predetermined resistance ratios to output a divided pumping voltage to the second switching element.

5. The voltage sensing circuit as recited in claim 4, wherein the voltage dividing unit includes a plurality of serially connected resistance elements.

6. The voltage sensing circuit as recited in claim 5, wherein the resistance elements include a first NMOS transistor.

7. The voltage sensing circuit as recited in claim 6, wherein the second switching element includes a second NMOS transistor that receives the divided pumping voltage through a gate terminal.

8. The voltage sensing circuit as recited in claim 1, wherein the first switching element includes an NMOS transistor that receives the reference voltage through a gate terminal.

9. The voltage sensing circuit as recited in claim 1, further comprising a buffering unit configured to buffer a differential amplification output of the first and second switching elements.

* * * * *